United States Patent
Chang et al.

(10) Patent No.: US 8,357,576 B2
(45) Date of Patent: Jan. 22, 2013

(54) METHOD OF MANUFACTURING SEMICONDUCTOR DEVICE

(75) Inventors: Chong-Kwang Chang, Incheon (KR); Sung-Hon Chi, Seoul (KR); Hong-Jae Shin, Seoul (KR); Yong-Jin Chung, Suwon-si (KR); Young-Mook Oh, Hwaseong-si (KR); Ju-Beom Yi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/007,096

(22) Filed: Jan. 14, 2011

(65) Prior Publication Data

US 2011/0195550 A1    Aug. 11, 2011

(30) Foreign Application Priority Data

Feb. 11, 2010 (KR) .................. 10-2010-0012951

(51) Int. Cl.
     *H01L 21/8238*      (2006.01)
(52) U.S. Cl. ............... 438/230; 438/300; 257/E21.431; 257/E21.453; 257/E21.634
(58) Field of Classification Search .............. 438/180, 438/230, 300, 926; 257/E21.431, E21.453, 257/E21.634
See application file for complete search history.

(56) References Cited

U.S. PATENT DOCUMENTS

| | | | |
|---|---|---|---|
| 2001/0055842 A1* | 12/2001 | Uh et al. ................... | 438/183 |
| 2008/0283906 A1* | 11/2008 | Bohr ......................... | 257/327 |
| 2009/0186458 A1 | 7/2009 | Yu et al. | |
| 2009/0191675 A1 | 7/2009 | Mehrad et al. | |

FOREIGN PATENT DOCUMENTS

| | | |
|---|---|---|
| JP | 2003-007656 A | 1/2003 |
| KR | 10 2004-0063971 A | 7/2004 |

\* cited by examiner

*Primary Examiner* — Alexander Ghyka
*Assistant Examiner* — Stanetta Isaac
(74) *Attorney, Agent, or Firm* — Lee & Morse, P.C.

(57) ABSTRACT

A method of manufacturing a semiconductor device, the method including providing a semiconductor substrate; forming a gate pattern on the semiconductor substrate such that the gate pattern includes a gate dielectric layer and a sacrificial gate electrode; forming an etch stop layer and a dielectric layer on the semiconductor substrate and the gate pattern; removing portions of the dielectric layer to expose the etch stop layer; performing an etch-back process on the etch stop layer to expose the sacrificial gate electrode; removing the sacrificial gate electrode to form a trench; forming a metal layer on the semiconductor substrate including the trench; removing portions of the metal layer to expose the dielectric layer; and performing an etch-back process on the metal layer to a predetermined target.

19 Claims, 12 Drawing Sheets

METHOD OF MANUFACTURING SEMICONDUCTOR DEVICE

BACKGROUND

1. Field

Embodiments relate to a method of manufacturing a semiconductor device.

2. Description of the Related Art

Recently, techniques to reduce gate leakage current using a high-k dielectric instead of silicon oxide as a gate dielectric layer of a MOS field effect transistor have been used.

SUMMARY

Embodiments are directed to a method of manufacturing a semiconductor device.

At least one of the above and other features and advantages may be realized by providing a method of manufacturing a semiconductor device, the method including providing a semiconductor substrate; forming a gate pattern on the semiconductor substrate such that the gate pattern includes a gate dielectric layer and a sacrificial gate electrode; forming an etch stop layer and a dielectric layer on the semiconductor substrate and the gate pattern; removing portions of the dielectric layer to expose the etch stop layer; performing an etch-back process on the etch stop layer to expose the sacrificial gate electrode; removing the sacrificial gate electrode to form a trench; fanning a metal layer on the semiconductor substrate including the trench; removing portions of the metal layer to expose the dielectric layer; and performing an etch-back process on the metal layer to a predetermined target.

At least one of removing portions of the dielectric layer and removing portions of the metal layer may include CMP.

The etch stop layer may include silicon nitride and the dielectric layer includes silicon oxide.

The gate dielectric layer may include a high-k material having a permittivity higher than a permittivity of silicon oxide.

The sacrificial gate electrode may include poly-silicon.

The method may further include forming an epitaxial layer including a silicon alloy on the semiconductor substrate at sides of the gate pattern after forming the gate pattern, wherein forming the epitaxial layer includes an epitaxial growth process.

Performing the etch-back process on the metal layer to the predetermined target further may include performing an etch back process on the dielectric layer to the predetermined target.

At least one of the above and other features and advantages may also be realized by providing a method of manufacturing a semiconductor device, the method including providing a semiconductor substrate including a first transistor region and a second transistor region; forming a first gate pattern on the first transistor region of the semiconductor substrate such that the first gate pattern includes a first gate dielectric layer and a first sacrificial gate electrode; forming a second gate pattern on second transistor region of the semiconductor substrate such that the second gate pattern includes a second gate dielectric layer and a second sacrificial gate electrode; forming an etch stop layer and a dielectric layer on the first and the second gate patterns and the semiconductor substrate; removing portions of the dielectric layer to expose the etch stop layer; performing an etch back process on the etch stop layer to expose the first and the second sacrificial gate electrodes; removing the first sacrificial gate electrode to form a first trench; forming a first metal layer on the semiconductor substrate including the first trench; removing portions of the first metal layer to expose the dielectric layer; removing the second sacrificial gate electrode to form a second trench; forming a second metal layer on the semiconductor substrate including the second trench; removing portions of the second metal layer to expose the dielectric layer; and performing an etch back process on the first metal layer to a predetermined target.

At least one of removing portions of the dielectric layer, removing portions of the first metal layer, and removing portions of the second metal layer may include CMP.

The etch stop layer may include silicon nitride and the dielectric layer includes silicon oxide.

The gate dielectric layer may include a high-k material having a permittivity higher than a permittivity of silicon oxide.

The first and second sacrificial gate electrodes may include poly-silicon.

The method may further include forming an epitaxial layer on the semiconductor substrate at sides of at least one of the first gate pattern and the second gate pattern with an epitaxial growth process after forming the first gate pattern and the second gate pattern such that the epitaxial layer includes silicon alloy.

Performing the etch back process on the first metal layer to the predetermined target may further include performing an etch back process on the dielectric layer to the predetermined target.

The first transistor region and the second transistor region may be an NMOS transistor region and a PMOS transistor region, respectively, or a PMOS transistor region and an NMOS transistor region, respectively.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2010-0012951, filed on Feb. 11, 2010, in the Korean Intellectual Property Office, and entitled: "Methods for Manufacturing Semiconductor Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items.

Spatially relative terms, such as "below," "lower," "above," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the invention. Accordingly, the exemplary views may be modified depending on manufacturing technologies and/or tolerances. Therefore, the embodiments are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the invention.

FIGS. 1A through 1M illustrate sectional views of stages in a method of manufacturing a semiconductor device according to an embodiment.

Figure 1A:
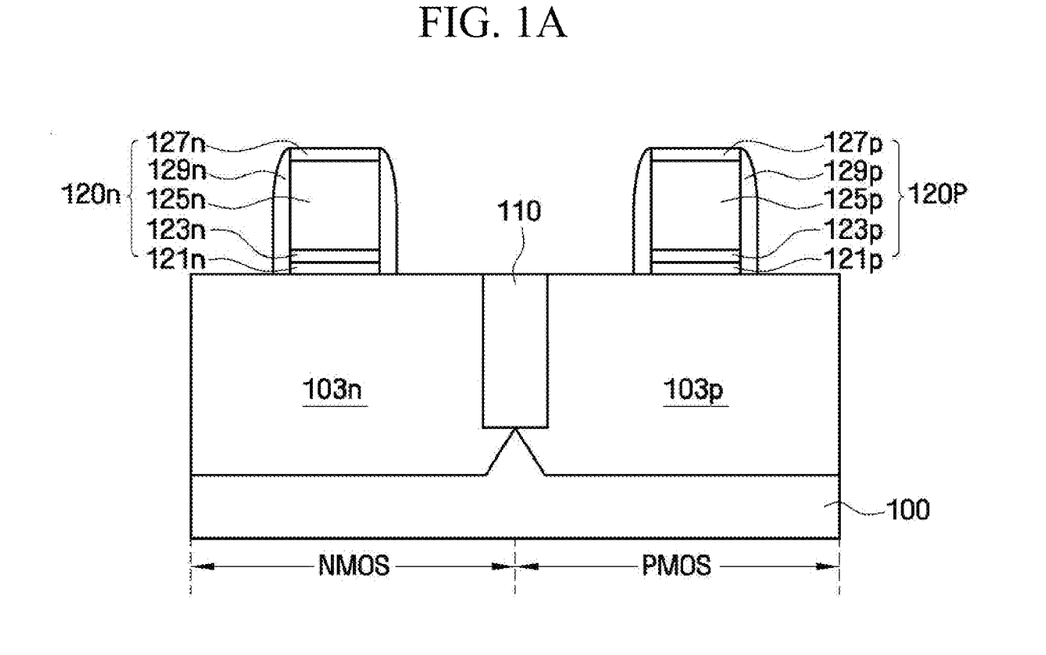
FIG. 1A through 1M illustrate sectional views of stages in a method of manufacturing a semiconductor device according to an embodiment.

Referring to FIG. 1A, a device isolation layer 110, a p-type well 103n and an n-type well 103p may be formed in a substrate 100 including an NMOS region and a PMOS region. Gate patterns 120n and 120p that include, e.g., gate dielectric layers 121n and 121p, sacrificial metal layers 123n and 123p, sacrificial gate electrodes 125n and 125p, gate hard masks 127n and 127p, and gate spacers 129n and 129p may be formed, respectively, on each of the NMOS region and the PMOS region of the substrate 100.

In an implementation, the substrate 100 may be a bulk substrate including semiconductor material such as Si or an SOI (Silicon-On-Insulator) substrate.

The device isolation layer 110 may define an active region of the substrate 100 and may be formed by using a STI (Shallow Trench Isolation) process.

The p-type well 103n in the NMOS region of the substrate 100 may be formed by performing an ion implantation of p-type impurities, e.g., boron, into the substrate 100 while the NMOS region is exposed using a photoresist pattern. The n-type well 103p in the PMOS region of the substrate 100 may be formed by performing an ion implantation of n-type impurities, e.g., phosphorus or arsenic, into the substrate 100 while the PMOS region is exposed using a photoresist pattern.

After materials that constitute the gate dielectric layers 121n and 121p, the sacrificial metal layers 123n and 123p, the sacrificial gate electrodes 125n and 125p, and the gate hard masks 127n and 127p are sequentially formed on the substrate 100, these materials may be patterned to form a structure in which the gate dielectric layers 121n and 121p, the sacrificial metal layers 123n and 123p, the sacrificial gate electrodes 125n and 125p, and the gate hard masks 127n and 127p are sequentially stacked, followed by forming the gate spacers 129n and 129p on sidewalls of the stacked structure. As a result, the gate patterns 120n and 120p may be formed.

Although the gate dielectric layers 121n and 121p may include a high-k dielectric having a permittivity higher than that of silicon oxide, the embodiments are not limited thereto, and the gate dielectric layers 121n and 121p may include silicon oxide. The high-k dielectric may include, e.g., hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate. Such gate dielectric layers 121n and 121p may be formed by a vapor deposition method, e.g., CVD (Chemical Vapor Deposition), PVD (Physical Vapor Deposition), or ALD (Atomic Layer Deposition), and may have a thickness, e.g., equal to or less than about 60 Å.

The sacrificial metal layers 123n and 123p may include a material, e.g., titanium nitride, that does not react with a material placed thereon and may tolerate high temperature. The sacrificial metal layers 123n and 123p may be formed by, e.g., sputtering or an ALD method.

The sacrificial gate electrodes 125n and 125p may include, e.g., poly-silicon. The sacrificial gate electrodes 125n and 125p may formed by, e.g., a vapor deposition method, and may have a thickness of about 500 Å to about 2,000 Å. However, the embodiments are not limited thereto. Such sacrificial gate electrodes 125n and 125p may be replaced with metal gate electrodes later, as will be described below.

The gate hard masks 127n and 127p may include, e.g., silicon nitride. The gate hard masks 127n and 127p may have a thickness of, e.g., about 100 Å to about 1,000 Å. However, the embodiments are not limited thereto.

The gate spacers 129n and 129p may be formed by, e.g., vapor deposition of dielectric material having a uniform deposition thickness on an entire structure including the substrate 100 and the gate patterns 120n, 120p, e.g., the sequentially stacked gate dielectric layers 121n and 121p, sacrificial metal layers 123n and 123p, sacrificial gate electrodes 125n and 125p, gate hard masks 127n and 127p. Thus, an anisotropic etch may be performed on the dielectric material. The gate spacers 129n and 129p may include, e.g., silicon nitride.

Although not shown in the drawings, after forming the gate patterns 120n and 120p, a low concentration source/drain region (not shown) may be formed in the substrate 100 at sides of the gate patterns 120n and 120p. The low concentration source/drain region may be formed by ion implanting n-type impurities, e.g., phosphorus or arsenic, into the NMOS region and p-type impurities, e.g., boron, into the PMOS region, followed by an annealing process.

Figure 1B:
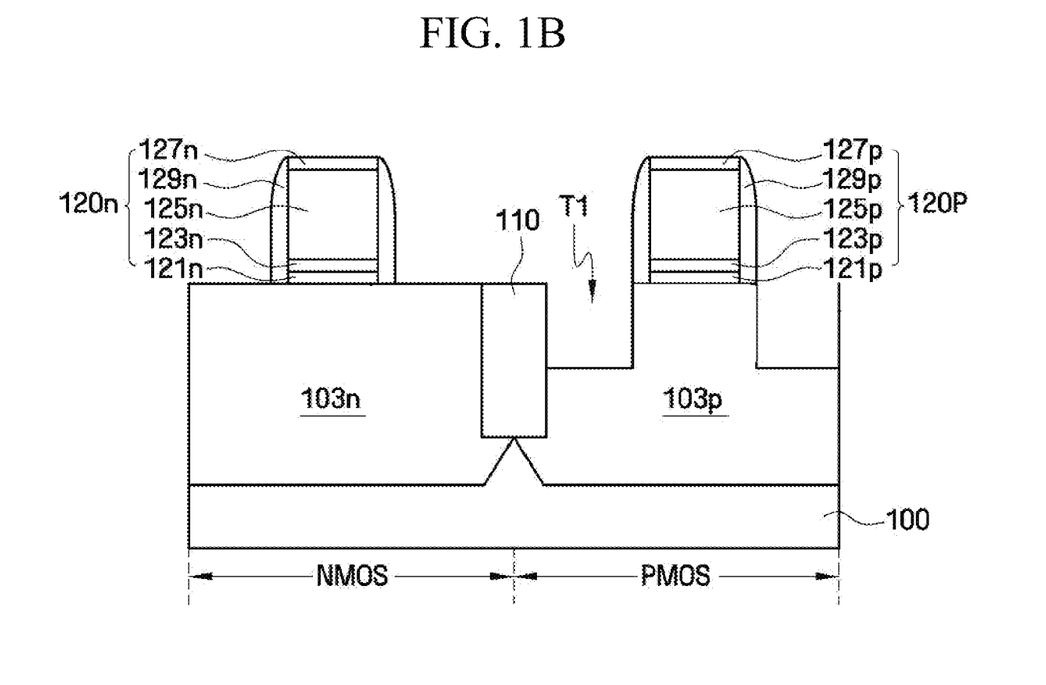

Next, referring to FIG. 1B, by etching the substrate 100 at sides of the gate pattern of the PMOS region 120p a first trench T1 may be formed.

For example, after the NMOS region is covered with dielectric material (not shown) or photoresist pattern (not shown), isotropic etching or anisotropic etching may be performed on the substrate 100 to form the first trench T1, e.g., while the PMOS region is exposed. The first trench T1 may facilitate formation of an epitaxial layer to be described below. Various parameters of the first trench T1 (e.g., depth, width, or width of a vertical direction of FIG. 1B sectional view) may be controlled based on desired operation of a PMOS device.

Figure 1C:
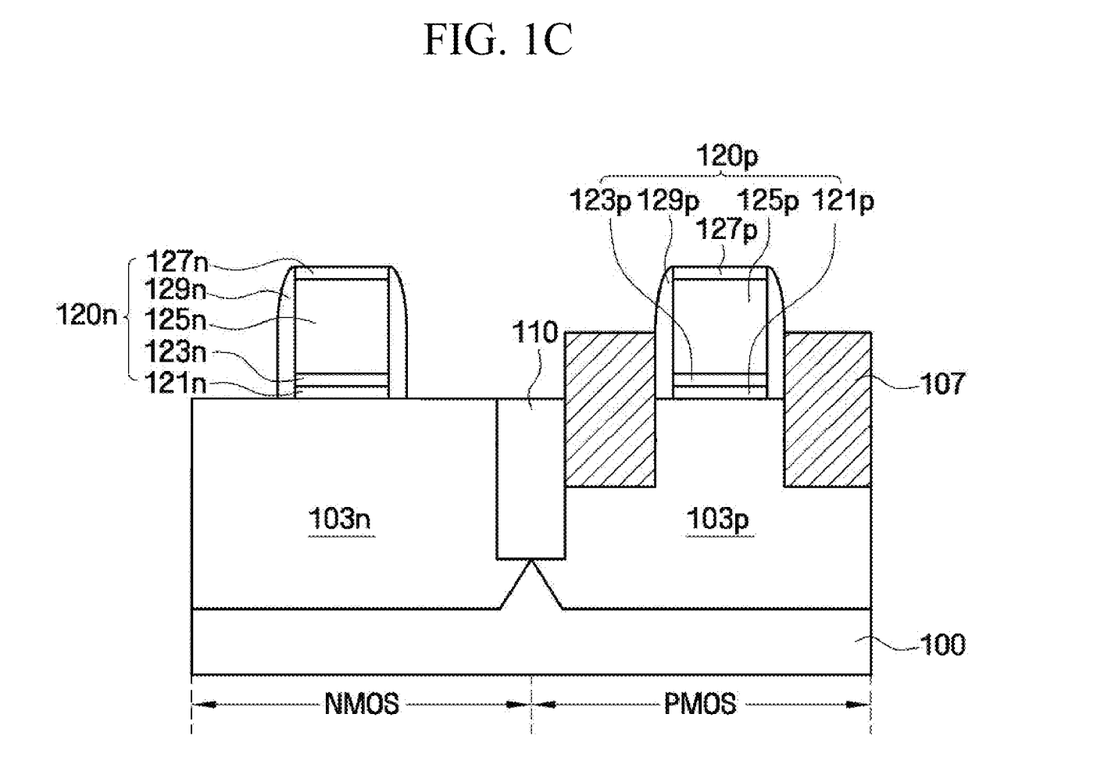

Then, referring to FIG. 1C, an epitaxial layer 107 including, e.g., silicon alloy, may be formed in the first trench T1.

For example, after the NMOS region is covered with dielectric material (not shown) and pre-cleaning is performed on a surface of the first trench T1 while the PMOS region is exposed, the epitaxial layer 107 including, e.g., silicon alloy, may be formed by using epitaxial growth process. When the epitaxial growth process is used, the epitaxial layer 107 may be formed only on the exposed substrate 100. As a result, the gate pattern 120p of the PMOS region may be protected.

The epitaxial layer 107 including silicon alloy may include, e.g., a SiGe layer. In an implementation, the epitaxial layer 107 may include high concentration p-type impurities, e.g. boron, doped. Such a layer may be formed by, e.g., doping p-type impurities in-situ while forming the epitaxial layer 107 or by doping p-type impurities after forming the undoped epitaxial layer 107. Here, high concentration means relatively high concentration compared to a concentration of the above-described low concentration source/drain region.

The epitaxial layer 107 including silicon alloy may be formed in the first trench T1 of the PMOS region to improve operational characteristics of the PMOS device by creating pressure transformation by applying compressive stress to a channel region of the PMOS device. In this step, due to characteristics of the epitaxial growth process, the epitaxial layer 107 may have a height sufficient to ensure that a surface of the epitaxial layer 107 extends above a surface of the substrate 100 and below a surface of the sacrificial gate electrode 125p. For example, a height difference between the surface of the epitaxial layer 107 and the surface of the sacrificial gate electrode 125p may be about 1,000 Å or less.

Although not illustrated in the drawings, before or after formation of the epitaxial layer 107, while leaving the NMOS region exposed, high concentration source/drain regions (not shown) may be formed by performing ion implantation with high concentration n-type impurities, e.g., phosphorus or arsenic, into the substrate 100 at sides of the gate pattern 120n of the NMOS region followed by annealing. Here, as previously described, high concentration means a higher concentration compared to the concentration of the low concentration source/drain regions.

In an implementation, although not illustrated in the drawings, a silicide layer (not shown) may be additionally formed on a top of the source/drain regions of the NMOS region or on a top of the source/drain regions of the PMOS region, e.g., a top of the epitaxial layer 107.

Figure 1D:
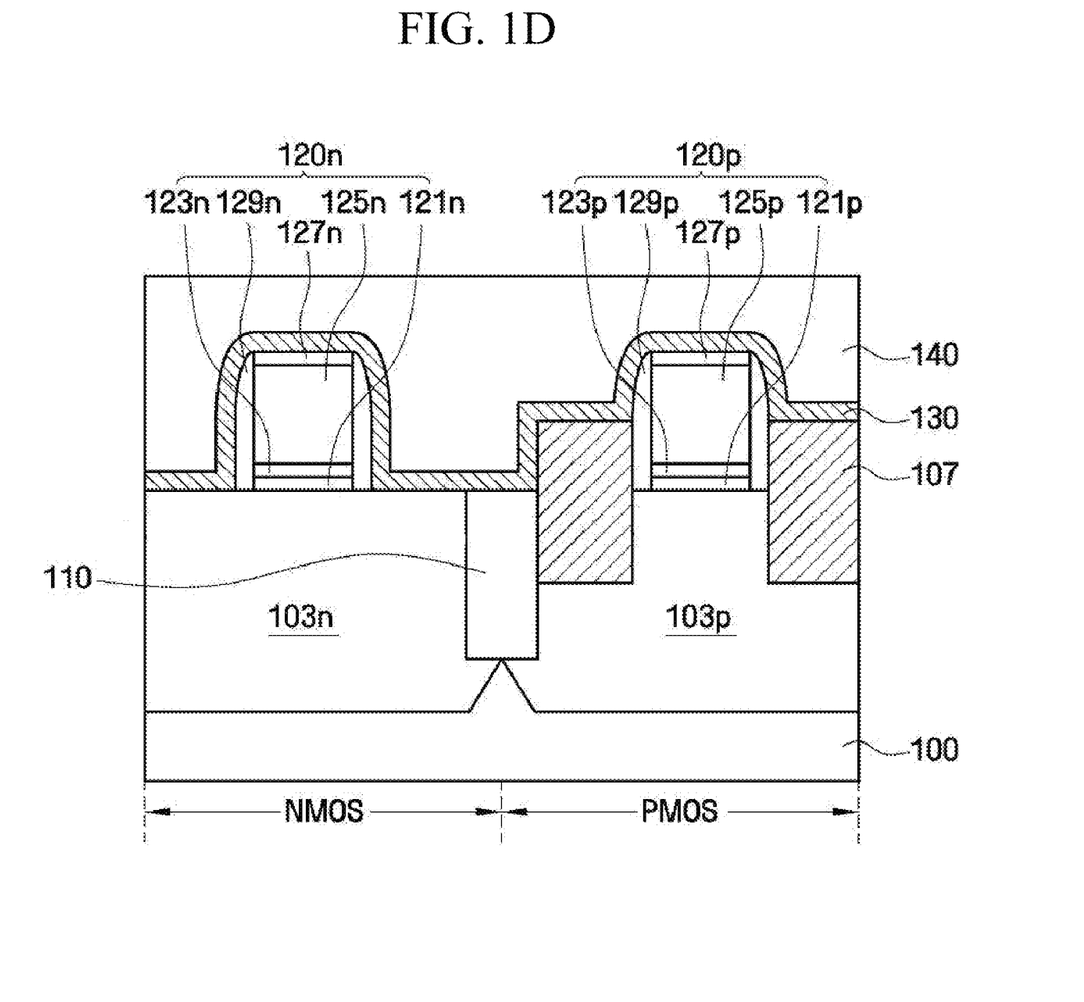

Next, referring to FIG. 1D, an etch stop layer 130 may be formed on an entire surface of the structure formed according to the process of FIG. 1C. Then, a first dielectric layer 140 may be formed on the etch stop layer 130.

The etch stop layer 130 may include the same material as that of the gate hard masks 127n and 127p and/or the gate spacers 129n and 129p, e.g. silicon nitride. The etch stop layer 130 may be formed by a vapor deposition process, e.g., CVD.

The first dielectric layer 140 may include a material different from that of the etch stop layer 130, e.g., silicon oxide. The first dielectric layer 140 may be formed by a vapor deposition process, e.g., a high density plasma chemical vapor deposition (HDP CVD) process.

Then, a process that exposes the sacrificial gate electrodes 125n and 125p may be performed. Subsequently, a replacement gate process that replaces the sacrificial gate electrodes 125n and 125p with a metal gate electrodes may be performed. These processes may include two step processes as illustrated in FIGS. 1E and 1F.

Figure 1E:
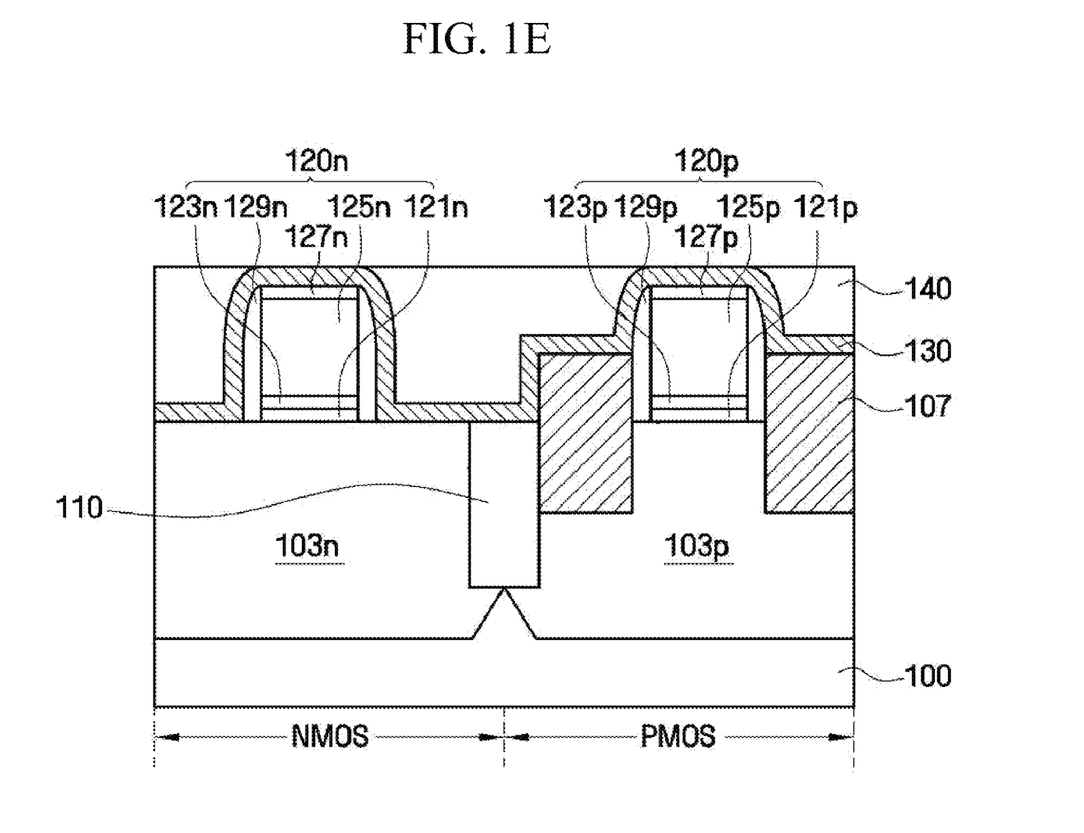

Referring to FIG. 1E, the first dielectric layer 140 may be polished. The polishing may stop at the first etch stop layer 130. Polishing of the first dielectric layer 140 may include, e.g., CMP (Chemical Mechanical Polishing).

As previously described, the surface of the epitaxial layer 107 may be lower than the surface of the sacrificial gate electrode 125p by about 1,000 Å. Thus, over-polishing may adversely affect the epitaxial layer 107 of the PMOS region if polishing is performed until the sacrificial gate electrodes 125n and 125p are exposed. Accordingly, polishing may stop at the first etch stop layer 130 in order to prevent the epitaxial layer 107 from being adversely affected.

Figure 1F:
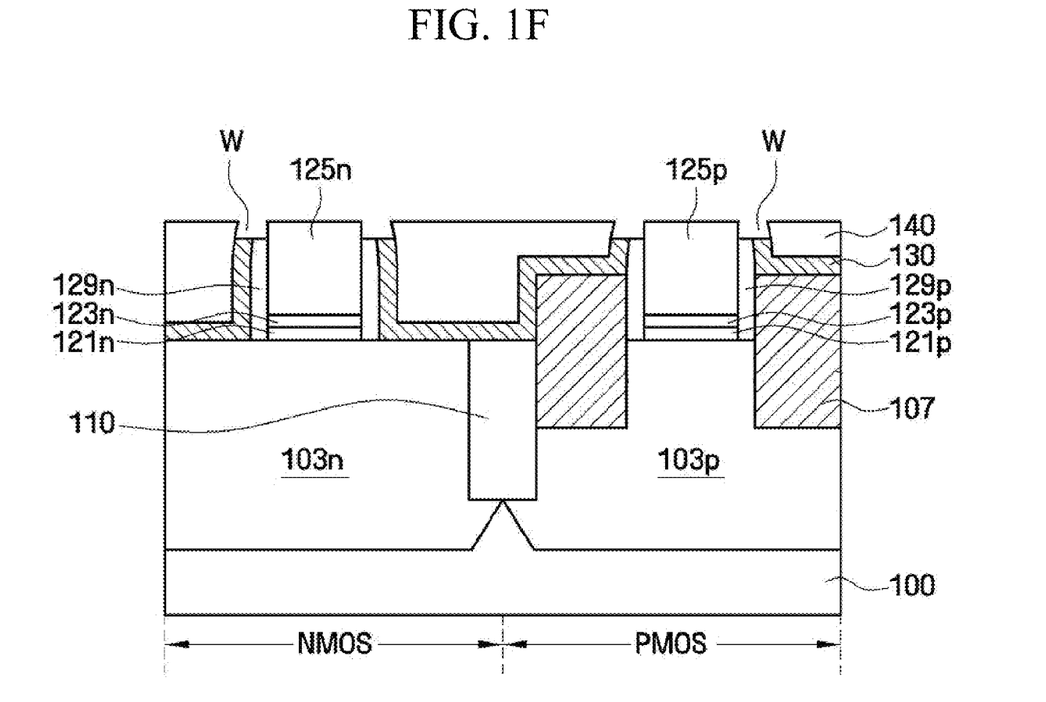

Next, referring to FIG. 1F, by performing an etch-back process on the etch stop layer 130, the gate hard masks 127n and 127p under the etch stop layer 130, and portions of the gate spacers 129n and 129p, the sacrificial gate electrodes 125n and 125p may be exposed. For example, polishing of the first dielectric layer 140 may stop at the first etch stop layer 130; and materials that remain on the sacrificial gate electrodes 125n and 125p may be removed by performing the etch-back process.

Here, as previously described, the etch stop layer 130, the gate hard masks 127n and 127p, and the gate spacers 129n and 129p may include the same material, e.g. silicon nitride. Thus, the etch-back process may be performed on the etch stop layer 130, the gate hard masks 127n and 127p, and the gate spacers 129n and 129p using a single step process.

As a result of the etch back process, portions of the gate spacers 129n and 129p and the etch stop layer 130 on sidewalls of the sacrificial gate electrodes 125n and 125p may be over-etched to form a concave shape (see W of FIG. 1F). Hereinafter, such shape is called a concavity W. Defects may occur due to such concavity W, and more detailed explanations will be provided below.

Figure 1G:
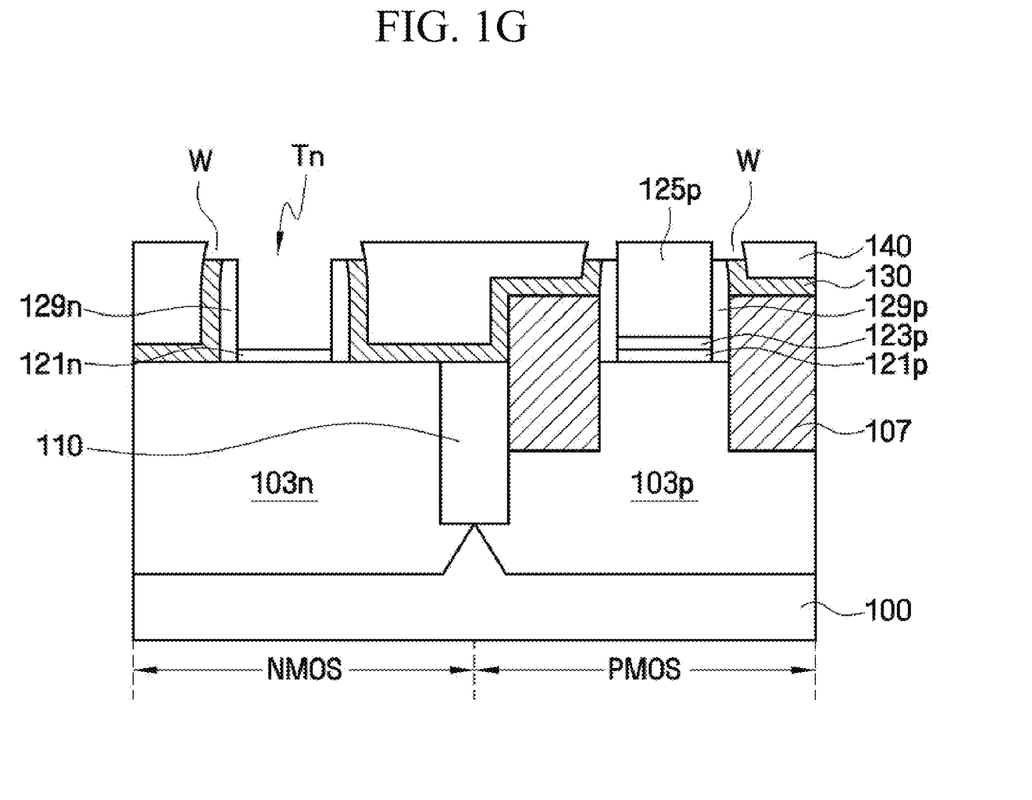

Referring to FIG. 1G, the sacrificial gate electrode 125n and the lower sacrificial metal layer 123n of the NMOS region may be removed. As a result, a trench Tn defined by the gate spacers 129n and the gate dielectric layer 121n may be formed.

The sacrificial gate electrode 125n and the sacrificial metal layer 123n of the NMOS region may be removed by, e.g., a wet etch or dry etch process while the NMOS region is exposed. For example, when performing a wet etch process, the sacrificial gate electrode 125n and the sacrificial metal layer 123n may be removed by exposing the sacrificial gate electrode 125n and the sacrificial metal layer 123n to an aqueous solution including hydroxide.

Although the figures illustrate removal of the sacrificial metal layer 123n, the embodiments are not limited thereto. The sacrificial metal layer 123n may not be removed and may remain on the gate dielectric layer 121n.

Figure 1H:
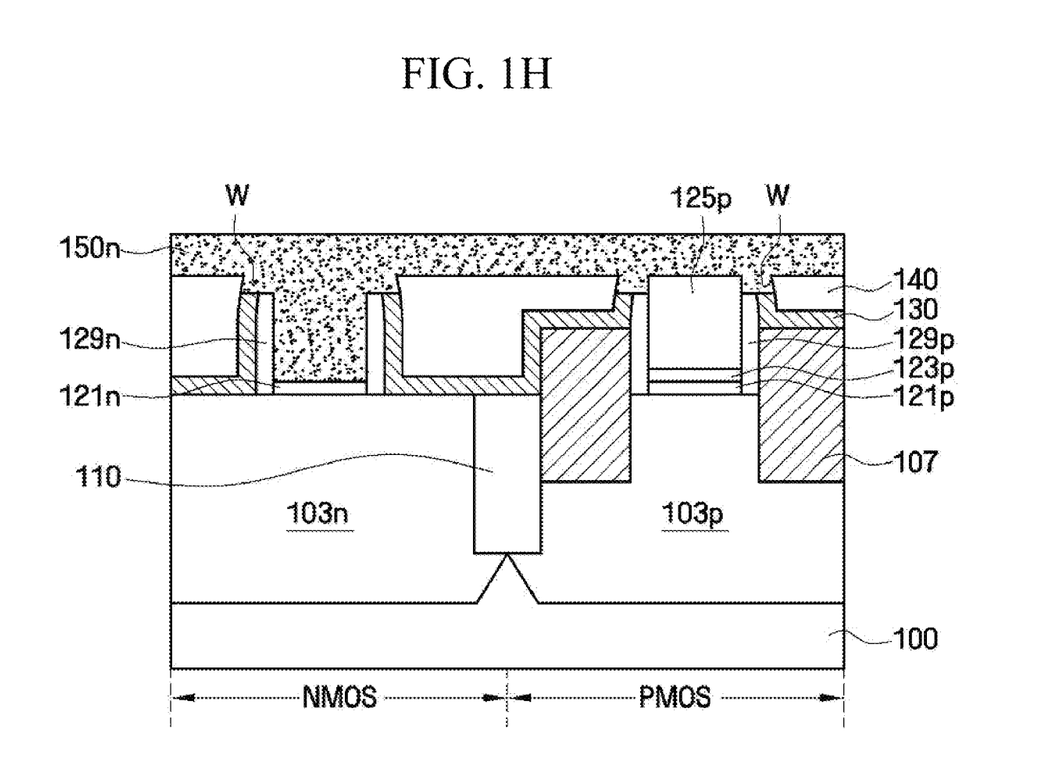

Next, referring to FIG. 1H, a first metal layer 150n may be formed on the entire structure formed according to the process of FIG. 1G. The first metal layer 150n may have a thickness sufficient to fill the trench Tn.

The first metal layer 150n may form a gate electrode of the NMOS region. The first metal layer 150n may be a single layer or a multiple layer and may include, e.g., hafnium, zirconium, titanium, tantalum, and/or aluminum, or compound thereof. In an implementation, the first metal layer 150n may be a single layer including aluminum-titanium alloy, but the embodiments are not limited thereto.

The first metal layer 150n may be formed by vapor deposition process, e.g., CVD, PVD, ALD or sputtering.

Figure 1I:
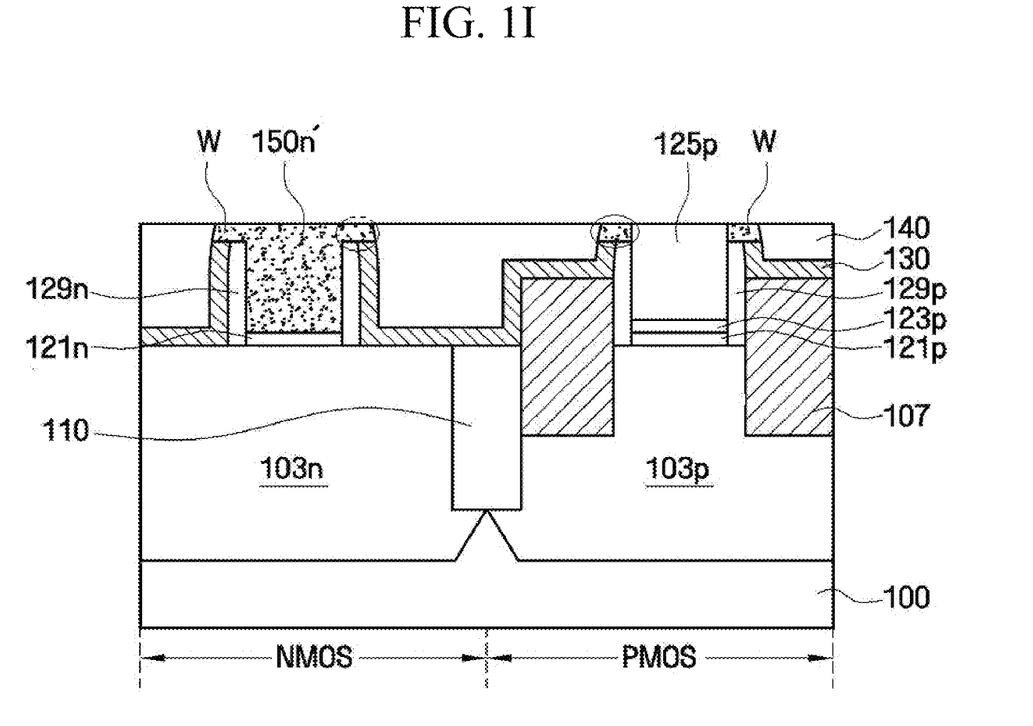

Then, referring to FIG. 1I, the first metal layer 150n may be polished such that the polishing stops at the first dielectric layer 140. Thus, the first dielectric layer 140 may function similarly to the previously described etch stop layer 130. After completion of the process illustrated in FIG. 1I, the first metal layer 150n may remain inside the trench Tn and may form a first metal gate electrode 150n'. Thus, as previously described, the sacrificial gate electrode 125n may be replaced with the first metal gate electrode 150n'. The first metal layer 150n polishing may be performed using, e.g., CMP.

Here, the concavity W formed according to the etch back process of the previously described FIG. 1F may be in a concave shape, e.g., toward a bottom. Thus, when polishing the first metal layer 150n using the first dielectric layer 140 as an etch stop layer, metal material of the first metal layer 150n may remain in the concavity W (refer to the circled area of FIG. 1I).

Figure 1J:
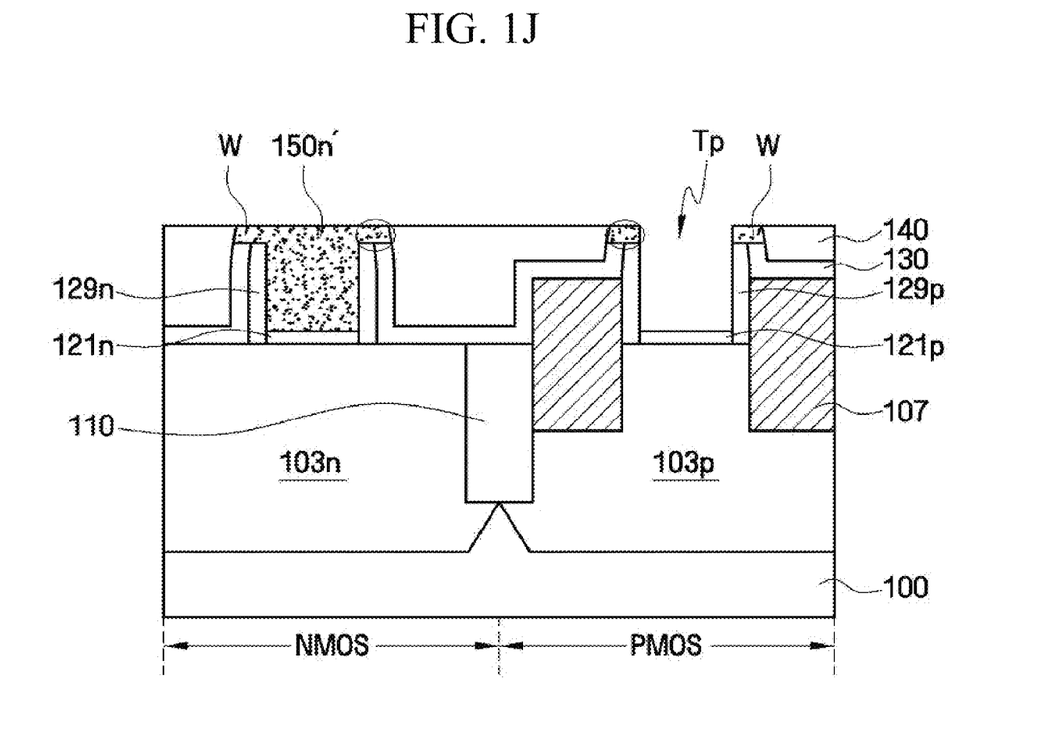

Next, referring to FIG. 1J, the sacrificial gate electrode 125p and the lower sacrificial metal layer 123p of the PMOS region may be removed. As a result, a trench Tp defined by the gate spacers 129p and the gate dielectric layer 121p may be formed.

Removal of the sacrificial gate electrode 125p and the sacrificial metal layer 123p of the PMOS region may be practically identical to the removal the sacrificial gate electrode 125n and the sacrificial metal layer 123n of the NMOS region, except that the former may be performed while the PMOS region is exposed. In an implementation, wet etching or dry etching may be used to remove the sacrificial gate electrode 125p and the sacrificial metal layer 123p.

Although it is illustrated that the sacrificial metal layer 123p is removed, the embodiments are not limited thereto. For example, the sacrificial metal layer 123p may not be removed and may remain on the gate dielectric layer 121p.

Figure 1K:
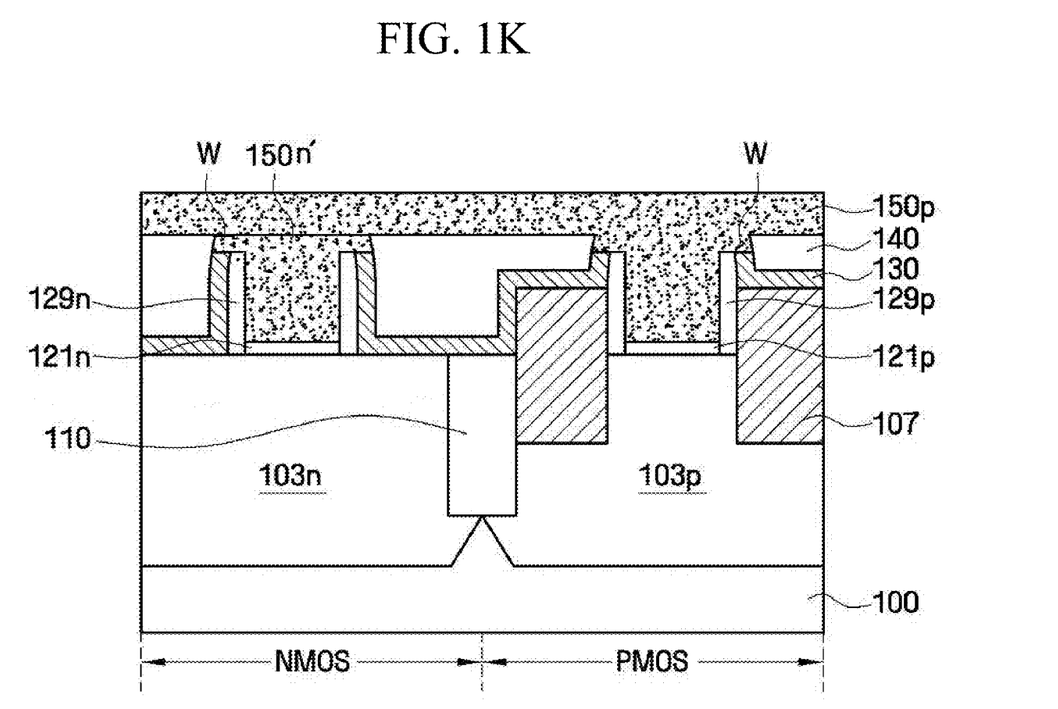

Next, referring to FIG. 1K, a second metal layer 150p may be formed on the entire structure formed according to the process of FIG. 1J and may have a thickness sufficient to fill the trench Tp.

The second metal layer 150p may form a gate electrode of the PMOS region and may include a same or different material from the previously described first metal layer 150n. The second metal layer 150p may be a single layer or a multiple layer and may include, e.g., hafnium, zirconium, titanium, tantalum, and/or aluminum, or compound thereof. In an implementation, the second metal layer 150p may be a double layer including stacked layer of titanium nitride and aluminum-titanium alloy, but the embodiments are not limited thereto.

The second metal layer 150p may be formed by a vapor deposition process, e.g., CVD, PVD, ALD, or sputtering.

Figure 1L:
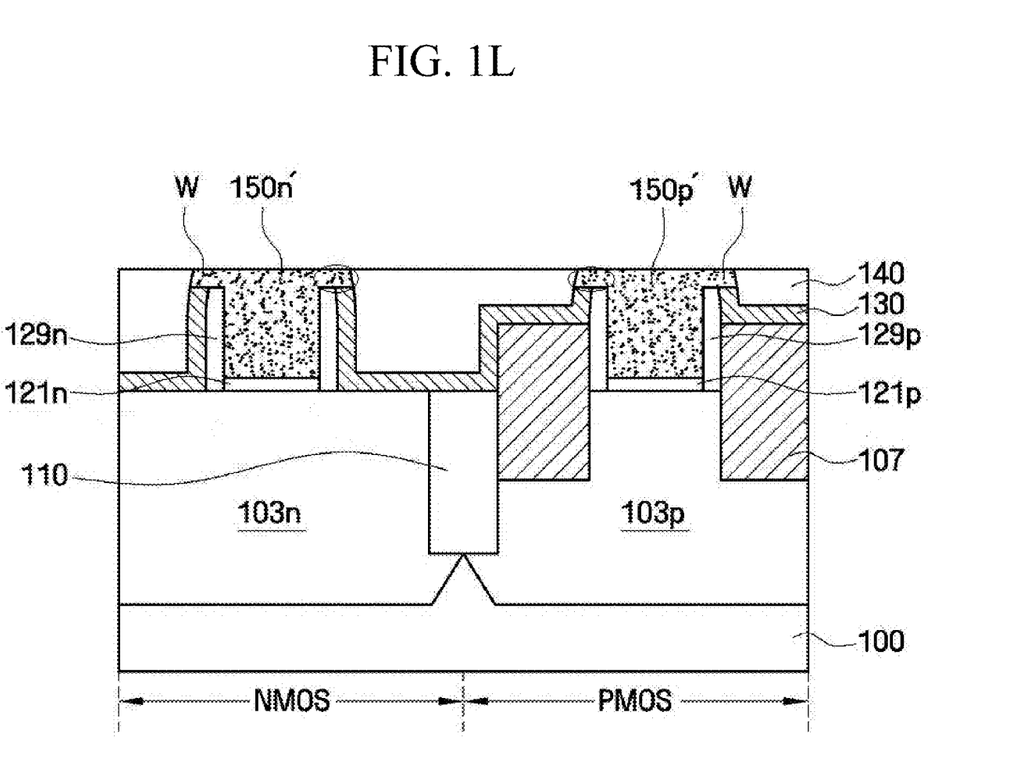

Then, referring to FIG. 1L, the second metal layer 150p may be polished such that the polishing stops at the first dielectric layer 140. Thus, the first dielectric layer 140 may function in a similar manner as the previously described etch stop layer 130. After completion of the process in this diagram, the second metal layer 150p may remain inside the second trench Tp and may form a second metal gate electrode 150p'. Thus, as previously described, the sacrificial gate electrode 125p may be replaced with the second metal gate electrode 150p'. The second metal layer 150p polishing may be performed using, e.g., CMP.

In the structure formed according to the process of FIG. 1L, the first metal gate electrode 150n' may be formed in the NMOS region and the second metal gate electrode 150p' may be formed in the PMOS region. As a result, a CMOS device including metal gate electrodes may be obtained. Furthermore, metal gate electrodes including different materials in the PMOS region and the NMOS region, respectively, may be obtained.

After forming the CMOS device including the first metal gate electrode 150n' and the second metal gate electrode 150p', a contact formation process may be performed as will be described below. The contact may connect to source/drain regions of the PMOS region, e.g., the epitaxial layer 107, or to source/drain regions of the NMOS region (not shown). A part to be connected to the contact may be dependent on desired semiconductor devices to be realized.

Figure 2:
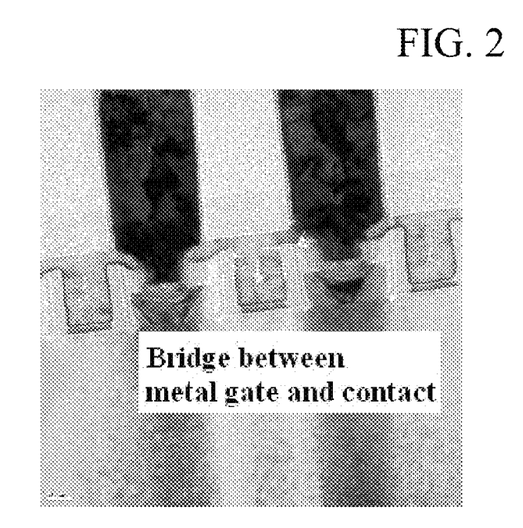
FIG. 2 illustrates a image showing a defect that may occur in a semiconductor device.

However, as described earlier, metal material may exist in the concavity W (refer to the circle of FIG. 1L). Thus, an undesirable bridge may occur between the contact and the metal material in the concavity W. As a result, the first metal gate electrode 150n' and/or the second metal gate electrode 150p' and the contact may be electrically shorted and a defect may occur. Such a defect is illustrated in the image of FIG. 2.

Figure 1M:
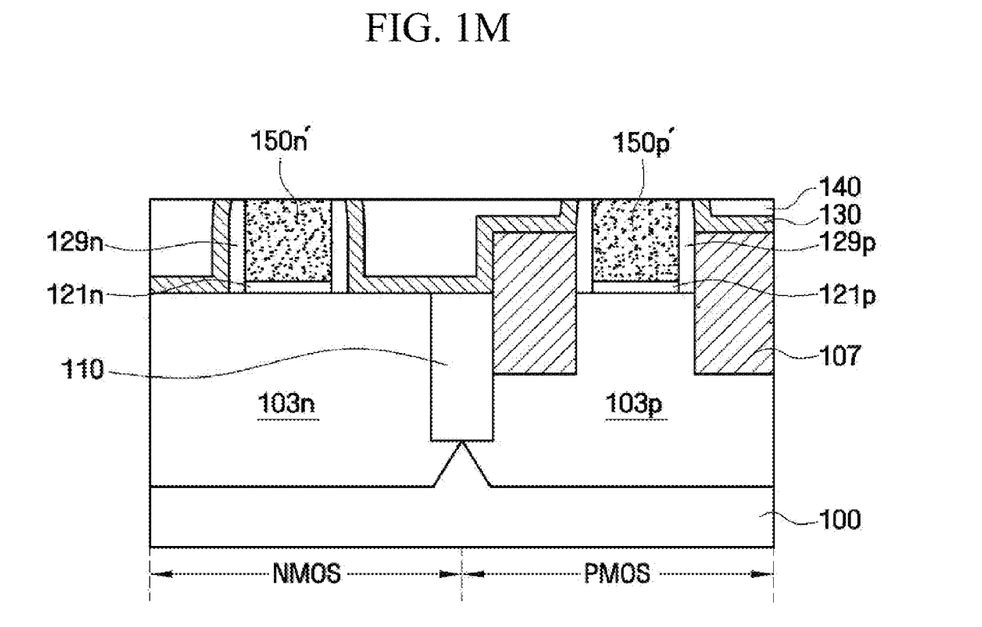

Thus, after performing the process of FIG. 1L, a process of FIG. 1M may be additionally performed.

Referring to FIG. 1M, by performing an etch back process on the first metal gate electrode 150n' to a predetermined target, metal material in the concavity W may be removed. In the present embodiment, the metal material forming the first gate electrode 150n' may exist in the concavity W. Thus, the etch back process may be performed on the first gate electrode 150n'. The etch back process may be performed to the predetermined target, e.g., below or a depth deeper than about 100 Å, enough to remove metal material that remains in the concavity W.

When the first metal gate electrode 150n' includes aluminum-titanium alloy and the metal material remaining in the concavity W is aluminum-titanium alloy, the etch back process may be performed using etch gas, e.g., $Cl_2$ or $BCl_3$. However, the embodiments are not limited thereto, and various etch gases may be used depending on the metal material remaining in the concavity W.

In addition to the etch back process performed on the first gate electrode 150n', an etch back process may be performed on the first dielectric layer 140 to the same predetermined target. When the first dielectric layer 140 includes silicon oxide, the etch back process may be performed using, e.g., CF-based etch gas. The etch back process may be performed on the first dielectric layer 140 in order to planarize a surface of the resultant structure formed according to the process of FIG. 1M and to allow subsequent processes to be performed easily.

As a result of the etch back process, the metal material remaining in the concavity W may be removed. Thus, as described above, the contact formation process may not create a bridge between the metal gate electrode the contact, thereby preventing defects.

Then, although not illustrated in the drawings, the contact formation process may be performed. For example, after forming a second dielectric layer (not shown) on the structure formed according to the process of FIG. 1M, the second dielectric layer, the first dielectric layer 140, and the etch stop layer 130 may be selectively etched to form a contact hole that exposes a desired region, e.g., the source/drain region of the NMOS or the epitaxial layer 107 of the PMOS. Next, by filling the contact hole with conductive material, the contact that connects to the source/drain region of the NMOS or the epitaxial layer 107 of the PMOS may be formed.

In the present embodiment, as an example of semiconductor device, a method of fabricating a CMOS device has been described; however, the embodiments are not limited thereto. The embodiments may be applied to fabrication methods of all semiconductor devices that use a replacement gate process.

Also, in the present embodiment, although the epitaxial layer may be formed on the source/drain region of the PMOS, the embodiments are not limited thereto. The epitaxial layer may be formed, e.g., on the source/drain region of the NMOS or in neither of the NMOS and PMOS regions. Also, the epitaxial layer may be formed without forming the trench in the NMOS region or PMOS region.

Also, in the present embodiment, although it is illustrated that the first metal gate electrode 150n' may be formed first and then the second metal gate electrode 150p' later, the embodiments are not limited thereto; and the formation order may change. Furthermore, when the first metal gate electrode 150n' and the second metal gate electrode 150p' include the same material, they may be formed simultaneously. Thus, trenches Tn and Tp may be formed simultaneously; and a metal layer that simultaneously fills the trenches Tn and Tp may be formed.

According to the embodiments, a high-k dielectric may be compatible with a metal used for a gate electrode. Furthermore, according to the embodiments when fabricating a CMOS device which includes the metal gate electrode, an NMOS gate electrode and a PMOS gate electrode with different materials may be formed.

The embodiments include a replacement gate process. In the replacement gate process, after forming a sacrificial gate electrode and spacers on sidewalls of the sacrificial gate electrode, a space between spacers provided by removing the sacrificial gate electrode may be filled with metal material to form the metal gate electrode.

The embodiments provide a method of manufacturing a semiconductor device that prevents defects during a replacement gate process.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a semiconductor device, the method comprising:
    providing a semiconductor substrate;
    forming a gate pattern on the semiconductor substrate such that the gate pattern includes a gate dielectric layer and a sacrificial gate electrode;
    forming an etch stop layer and a dielectric layer on the semiconductor substrate and the gate pattern;
    removing portions of the dielectric layer to expose the etch stop layer;
    performing an etch-back process on the etch stop layer to expose the sacrificial gate electrode;
    removing the sacrificial gate electrode to form a trench;
    forming a metal layer on the semiconductor substrate including the trench, such that a lower portion of the metal layer is below an upper surface of the dielectric layer;
    removing portions of the metal layer to expose the dielectric layer; and
    performing an etch-back process on the metal layer to a predetermined target, such that the lower portion of the metal layer is at least partially removed,
    wherein an upper surface of the lower portion of the metal layer is wider than a bottom surface of the lower portion of the metal layer.

2. The method as claimed in claim 1, wherein at least one of removing portions of the dielectric layer and removing portions of the metal layer includes CMP.

3. The method as claimed in claim 1, wherein the etch stop layer includes silicon nitride and the dielectric layer includes silicon oxide.

4. The method as claimed in claim 1, wherein the gate dielectric layer includes a high-k material having a permittivity higher than a permittivity of silicon oxide.

5. The method as claimed in claim 4, wherein the sacrificial gate electrode includes poly-silicon.

6. The method as claimed in claim 1, wherein the sacrificial gate electrode includes poly-silicon.

7. The method as claimed in claim 1, further comprising:
    forming an epitaxial layer including a silicon alloy on the semiconductor substrate at sides of the gate pattern after forming the gate pattern, wherein forming the epitaxial layer includes an epitaxial growth process; and
    forming a contact connected to the epitaxial layer, the contact being proximate to a portion of the metal layer in the trench.

8. The method as claimed in claim 1, wherein performing the etch-back process on the metal layer to the predetermined target further includes performing an etch back process on the dielectric layer to the predetermined target.

9. The method as claimed in claim 1, wherein the lower portion of the metal layer includes a portion that does not overlap the gate dielectric layer.

10. A method of manufacturing a semiconductor device, the method comprising:
    providing a semiconductor substrate including a first transistor region and a second transistor region;
    forming a first gate pattern on the first transistor region of the semiconductor substrate such that the first gate pattern includes a first gate dielectric layer and a first sacrificial gate electrode;
    forming a second gate pattern on the second transistor region of the semiconductor substrate such that the second gate pattern includes a second gate dielectric layer and a second sacrificial gate electrode;
    forming an etch stop layer and a dielectric layer on the first and the second gate patterns and the semiconductor substrate;
    removing portions of the dielectric layer to expose the etch stop layer;
    performing an etch back process on the etch stop layer to expose the first and the second sacrificial gate electrodes;
    removing the first sacrificial gate electrode to form a first trench;
    forming a first metal layer on the semiconductor substrate including the first trench, such that a lower portion of the first metal layer is below an upper surface of the dielectric layer;
    removing portions of the first metal layer to expose the dielectric layer;
    removing the second sacrificial gate electrode to form a second trench;
    forming a second metal layer on the semiconductor substrate including the second trench;
    removing portions of the second metal layer to expose the dielectric layer; and
    performing an etch back process on the first metal layer to a predetermined target, such that the lower portion of the first metal layer is at least partially removed.

11. The method as claimed in claim 10, wherein at least one of removing portions of the dielectric layer, removing portions of the first metal layer, and removing portions of the second metal layer includes CMP.

12. The method as claimed in claim 10, wherein the etch stop layer includes silicon nitride and the dielectric layer includes silicon oxide.

13. The method as claimed in claim 10, wherein the gate dielectric layer includes a high-k material having a permittivity higher than a permittivity of silicon oxide.

14. The method as claimed in claim 13, wherein the first and second sacrificial gate electrodes include poly-silicon.

15. The method as claimed in claim 10, wherein the first and second sacrificial gate electrodes include poly-silicon.

16. The method as claimed in claim 10, further comprising:
forming an epitaxial layer on the semiconductor substrate at sides of at least one of the first gate pattern and the second gate pattern with an epitaxial growth process after forming the first gate pattern and the second gate pattern such that the epitaxial layer includes a silicon alloy; and forming a contact connected to the epitaxial layer, the contact being proximate to a portion of the metal layer in the trench.

17. The method as claimed in claim 10, wherein performing the etch back process on the first metal layer to the predetermined target further includes performing an etch back process on the dielectric layer to the predetermined target.

18. The method as claimed in claim 10, wherein the first transistor region and the second transistor region are an NMOS transistor region and a PMOS transistor region, respectively, or a PMOS transistor region and an NMOS transistor region, respectively.

19. The method as claimed in claim 10, wherein the lower portion of the first metal layer includes a portion that does not overlap the gate dielectric layer.

* * * * *